United States Patent [19]
Ead

[11] Patent Number: 5,727,727
[45] Date of Patent: Mar. 17, 1998

[54] FLOWING SOLDER IN A GAP

[75] Inventor: George J. Ead, Methuen, Mass.

[73] Assignee: VLT Corporation, San Antonio, Tex.

[21] Appl. No.: 853,983

[22] Filed: May 9, 1997

Related U.S. Application Data

[63] Continuation of Ser. No. 382,676, Feb. 2, 1995, abandoned.

[51] Int. Cl.⁶ .................................................. B23K 1/20
[52] U.S. Cl. .................... 228/123.1; 228/170; 228/173.5; 228/175; 428/645
[58] Field of Search ............................. 228/123.1, 165, 228/170, 124.1, 173.3, 175, 204, 215; 428/620, 645, 646

[56] References Cited

U.S. PATENT DOCUMENTS

| | | | |
|---|---|---|---|
| 3,071,854 | 1/1963 | Pighini | 29/473.1 |
| 3,429,040 | 2/1969 | Miller | 228/215 |
| 3,621,338 | 11/1971 | Rogers et al. | 317/101 |
| 3,683,241 | 8/1972 | Duncan | 317/234 |
| 3,737,724 | 6/1973 | Carney | 317/101 |
| 4,218,724 | 8/1980 | Kaufman | 361/395 |
| 4,278,990 | 7/1981 | Fichot | 357/81 |
| 4,400,762 | 8/1983 | Bartley et al. | 361/402 |
| 4,417,296 | 11/1983 | Schelhorn | 361/386 |
| 4,531,145 | 7/1985 | Wiech, Jr. | 357/81 |
| 4,551,746 | 11/1985 | Gilbert et al. | 357/74 |
| 4,551,747 | 11/1985 | Gilbert et al. | 357/74 |
| 4,650,107 | 3/1987 | Keser | 228/123.1 |
| 4,724,283 | 2/1988 | Shimada et al. | 174/68.5 |
| 4,740,414 | 4/1988 | Shaheen | 428/210 |
| 4,750,089 | 6/1988 | Derryberry et al. | 361/388 |
| 4,769,525 | 9/1988 | Leatham | 219/209 |
| 4,783,695 | 11/1988 | Eichelberger et al. | 357/65 |
| 4,783,697 | 11/1988 | Benenati et al. | 357/80 |
| 4,793,543 | 12/1988 | Gainey et al. | 228/123.1 |
| 4,847,136 | 7/1989 | Lo | 428/195 |
| 4,872,081 | 10/1989 | Murphy et al. | 361/117 |
| 4,879,630 | 11/1989 | Boucard et al. | 361/386 |
| 4,918,811 | 4/1990 | Eichelberger et al. | 29/840 |
| 4,953,005 | 8/1990 | Carlson et al. | 357/80 |
| 4,985,097 | 1/1991 | Matsumura et al. | 156/87 |
| 4,994,215 | 2/1991 | Wiech, Jr. | 264/27 |
| 4,996,116 | 2/1991 | Webster et al. | 428/627 |
| 5,006,673 | 4/1991 | Freyman et al. | 174/255 |
| 5,019,941 | 5/1991 | Craft | 361/386 |
| 5,019,946 | 5/1991 | Eichelberger et al. | 361/414 |
| 5,028,987 | 7/1991 | Neugebauer et al. | 357/80 |
| 5,176,309 | 1/1993 | Horiguchi et al. | 228/122 |
| 5,216,279 | 6/1993 | Nakao | 257/712 |
| 5,271,548 | 12/1993 | Maiwald | 228/175 |
| 5,280,850 | 1/1994 | Horiguchi et al. | 228/122.1 |
| 5,296,735 | 3/1994 | Fukunaga | 257/659 |
| 5,324,890 | 6/1994 | Lawlyes | 174/52.4 |
| 5,328,751 | 7/1994 | Komorita et al. | 428/209 |
| 5,365,403 | 11/1994 | Vinciarelli et al. | 361/707 |
| 5,372,295 | 12/1994 | Abe et al. | 228/123.1 |
| 5,447,267 | 9/1995 | Sakai et al. | 228/175 |

FOREIGN PATENT DOCUMENTS

| | | | |
|---|---|---|---|
| 0 141 582 A1 | 5/1985 | European Pat. Off. | G01J 5/34 |
| 0 264 122 A1 | 4/1988 | European Pat. Off. | H01L 21/60 |
| 0 577 484 A1 | 1/1994 | European Pat. Off. | C04B 37/02 |
| 1127179 | 4/1962 | Germany | 228/174 |
| 50-103452 | 8/1975 | Japan | H01L 27/00 |
| 51-9459 | 3/1976 | Japan | H05K 3/34 |
| 52-11769 | 1/1977 | Japan | H01L 21/58 |

(List continued on next page.)

OTHER PUBLICATIONS

Direct Metal Bonding, 08/336,994, Filed Nov. 10, 1994, John R. Saxelbey Jr. et al.

Gates and Yokoro, "Sealed Chip–On Board Circuit Protection", 3rd International Sample Electronics Conference, Jun. 20–22, 1989, pp. 929–938.

*Primary Examiner*—Kenneth J. Ramsey
*Attorney, Agent, or Firm*—Fish & Richardson P.C.

[57] ABSTRACT

The invention features a method for flowing solder in a gap between two surfaces. A supply of solder is heated to cause it to reflow and flow in the gap. The solder is directed to flow as a main stream in the gap and to flow as peripheral streams from the main stream toward edges of the gap to reduce formation of voids.

26 Claims, 6 Drawing Sheets

FOREIGN PATENT DOCUMENTS

| | | | |
|---|---|---|---|
| 54-8462 | 1/1979 | Japan | H01L 21/58 |
| 57-53948 | 3/1982 | Japan | H01L 21/58 |
| 57-190768 | 11/1982 | Japan | 228/123.1 |
| 61-156791 | 7/1986 | Japan | H05K 3/20 |
| 61-177762 | 8/1986 | Japan | H01L 23/48 |
| 63-119242 | 5/1988 | Japan | H01L 21/52 |
| 63-114095 | 7/1988 | Japan | H05K 9/00 |
| 1-161892 | 6/1989 | Japan | H05K 3/38 |
| 2-192792 | 7/1990 | Japan | H05K 3/34 |
| 4-83367 | 3/1992 | Japan | H01L 23/36 |
| 4-346260 | 12/1992 | Japan | H01L 25/07 |
| 05129515 | 5/1993 | Japan | H01L 25/00 |
| 6-23534 | 2/1994 | Japan | H01L 21/52 |
| 6-48851 | 2/1994 | Japan | C04B 37/92 |
| 6-90083 | 3/1994 | Japan | H05K 3/38 |
| 7-202475 | 8/1995 | Japan | H05K 9/00 |
| 7-254781 | 10/1995 | Japan | H05K 3/34 |

FLOWING SOLDER IN A GAP

This is a continuation of application Ser. No. 08/382,676, filed Feb. 2, 1995, now abandoned.

BACKGROUND

This invention relates to flowing solder in a gap.

Flowing solder in a gap is used, for example, to mount electronic components to metal mounting surfaces. To form the gap before the solder is flowed, the component may be held by epoxy dots as explained in U.S. patent application Ser. No. 08/337,269, filed Nov. 10, 1994, assigned to the same assignee as this application and incorporated by reference.

SUMMARY

In general, in one aspect, the invention features a method for flowing solder in a gap between two surfaces. A supply of solder is heated to cause it to reflow and flow in the gap. The solder is directed to flow as a main stream in the gap and to flow as peripheral streams from the main stream toward edges of the gap to reduce formation of voids.

Implementations of the invention may include the following features. The solder flow may be directed by providing a solder flow control pattern within the gap. The solder flow may also be directed by causing the main stream to follow a tortuous path, where the tortuous path may be a serpentine path or a straight path. The solder may be placed at an edge of the gap, and an unrestricted portal may be provided at the edge of the gap for flow of solder into the gap.

In general, in another aspect, the invention features a method for aiding flow of solder in a gap between two surfaces. A pattern of flow controlling elements is formed, and the two surfaces are held in positions to form a gap between them with the pattern in the gap.

Implementations of the invention may include the following features. The pattern may be formed by cutting the pattern into one of the surfaces, and the pattern may be cut with a laser or a chemical etching process or milled with a machine tool. The pattern may also be formed by stamping the pattern into one of the two surfaces. The surfaces may be solder wettable. The two surfaces may be held by dispensing epoxy dots on one of the two surfaces at predetermined points, placing the other of the two surfaces on the epoxy dots to establish the gap, and curing the epoxy dots. The pattern may aid in establishing the gap.

In general, in another aspect, the invention features a structure including two surfaces separated by a gap, a pattern of solder flow control elements in the gap, and a solder joint in the gap. The configuration of the solder joint is defined by the flow control elements.

Implementations of the invention may include the following features. The control elements may be a solder mask. The surfaces may be thermally conductive and solder wettable. The control elements may be staggered and may be fingers. The control elements may be a film, such as Kapton MT.

Advantages of the invention include the following. The formation of voids, e.g., trapped gas and flux liquids, in a solder filled gap between two surfaces is reduced by directing the flow of solder through the gap to push air, gases, and flux liquids out of the gap. The direction of solder flow can be especially designed to reduce the formation of voids in areas requiring greatest heat transfer.

Other advantages and features will become apparent from the following description and from the claims.

DESCRIPTION

Referring to FIGS. 1–4, to provide for maximum heat transfer between a heat dissipating component 10 and a metal mounting surface 12 (surface 12 can be part of another component, not shown) joined by solder flowed in a gap 38 between them, voids in the solder within the gap should be reduced or eliminated, especially in regions of high heat dissipation (e.g., regions where semiconductor dies 14 are mounted). This can be achieved using a solder flow control pattern 16 (e.g., a solder mask) having a configuration of legs 18 in a staggered arrangement. Legs 18 are parallel and the ends of alternate legs are interleaved in the area between dashed lines 20 and 22 to form a tortuous path for flowing solder.

Figure 1:
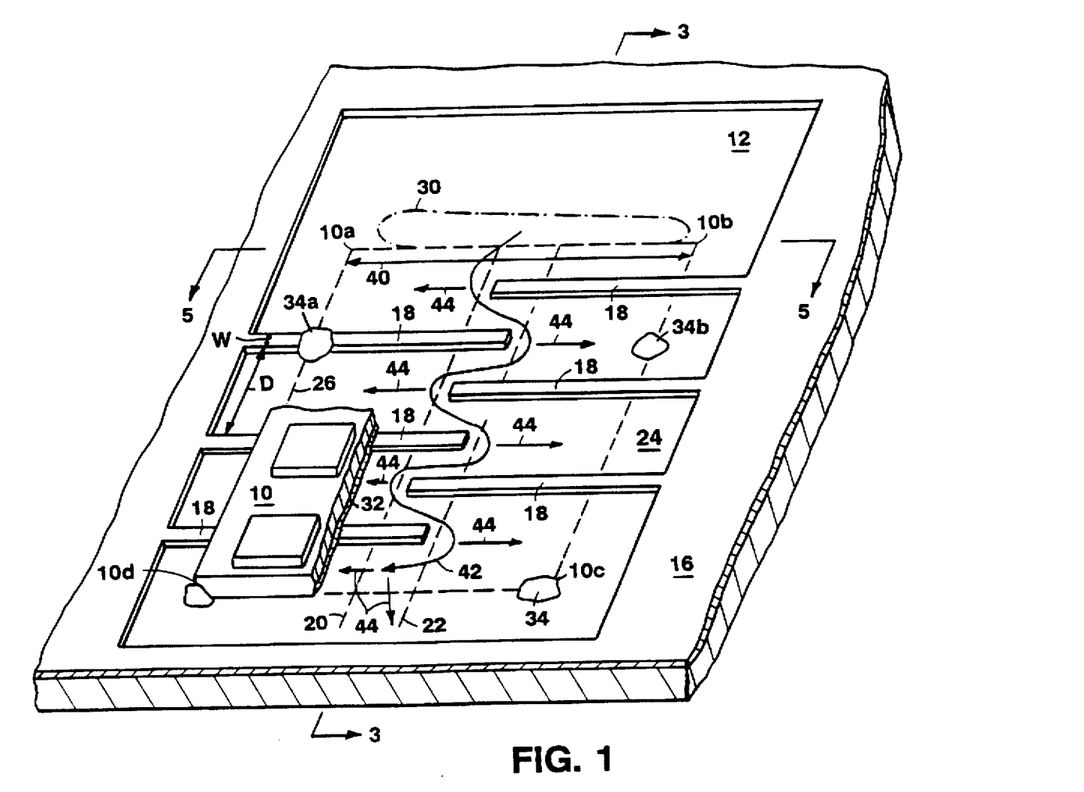
FIG. 1 is a perspective view of a solder flow control pattern.
Figure 2:
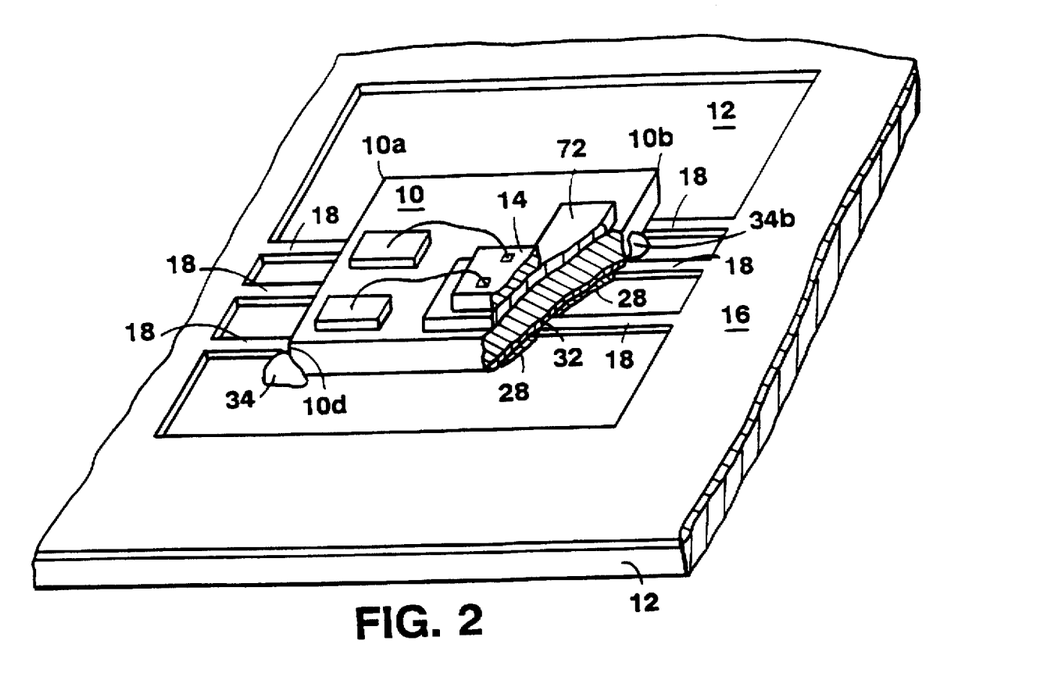
FIG. 2 is a perspective view of a mounted component.
Figure 3:
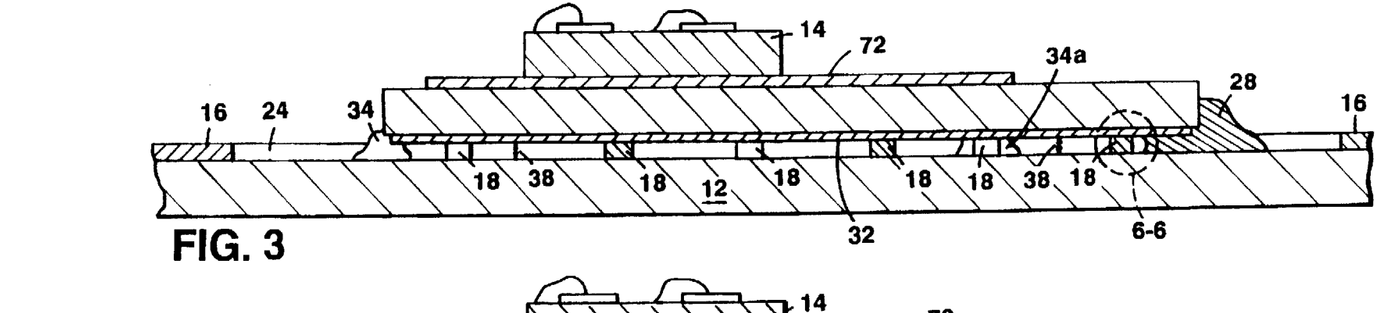
FIG. 3 is a cross-sectional view at 3—3 in FIG. 1.

In an example where component 10 is approximately 0.15 inches by 0.4 inches, each leg has a width W of approximately 0.008–0.012 inches and each leg is separated from its neighboring legs by a distance D of approximately 0.050–0.100 inches.

Figure 4:
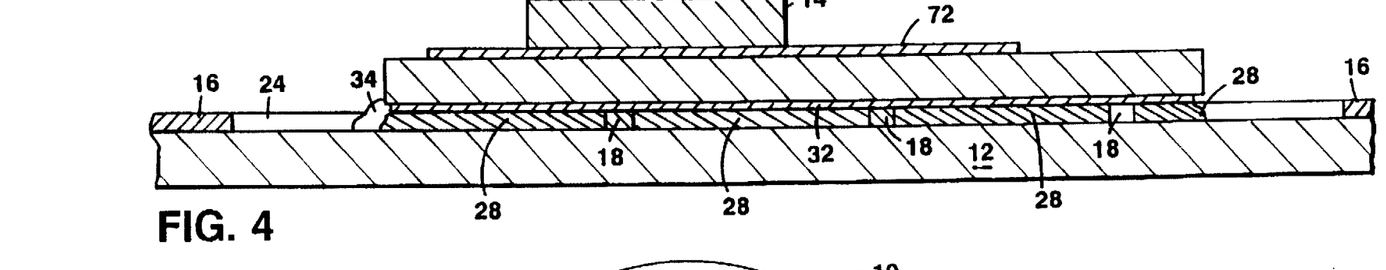
FIG. 4 is a cross-sectional view of a mounted component.

The solder mask is screen printed as pattern 16 onto surface 12 and then cured (e.g., hardened by baking or by exposure to ultraviolet light) at about 150° C. for approximately 3–40 minutes. Pattern 16 forms a corral 24 around the location 26 where component 10 will be placed and forms the staggered pattern of legs 18 within location 26. Prior to placing component 10 on epoxy dots 34, flux 41 (FIG. 5) may be applied to surface 12 in the area of location 26. After component 10 (only a portion of which is shown in FIG. 1) is placed, solder paste 28 is dispensed along one side of component 10 in the area indicated by dashed line 30 (FIG. 1). Surface 12 is then heated causing the epoxy to cure and the solder to reflow and flow into gap 38 to mount component 10 to surface 12 (FIG. 4).

Copper layer 32, on the bottom side of component 10, is plated (not shown) with a material that is wettable by solder, e.g., nickel and gold. Surface 12 is a solder wettable material or is plated (not shown) with a solder wettable material. The wettability of both surfaces allows the solder to flow freely once the molten solder comes in contact with both surfaces.

Figure 5:
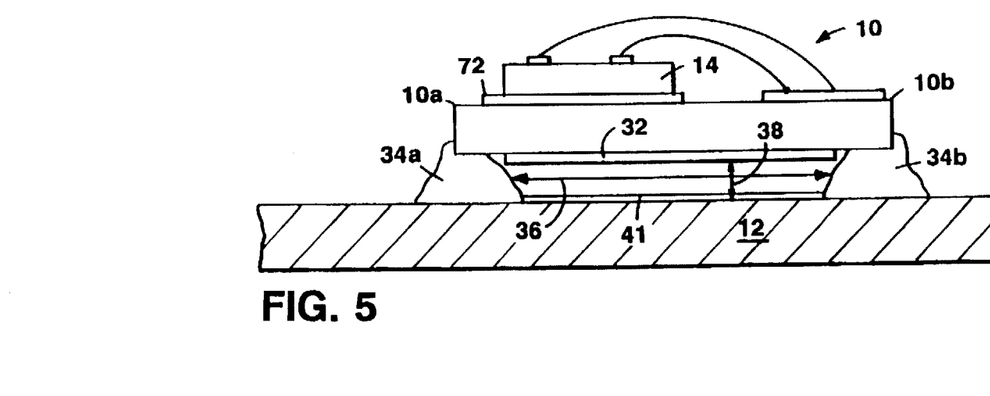
FIG. 5 is a cross-sectional view at 5—5 in FIG. 1.

When component 10 is pressed against epoxy dots 34 (including epoxy dots 34a and 34b), a portion of each dot is squeezed underneath component 10, as shown in FIG. 5. If the epoxy dots were placed at the corners 10a, 10b of component 10 in the area where the solder paste is applied, the length of a portal 36 through which solder paste could flow into gap 38, to come in contact with copper layer 32, would be restricted. As shown in FIG. 1, to provide a large portal 40, epoxy dots 34a and 34b may be moved back from the location of the corners 10a, 10b of component 10 (FIG. 1).

Figure 6:
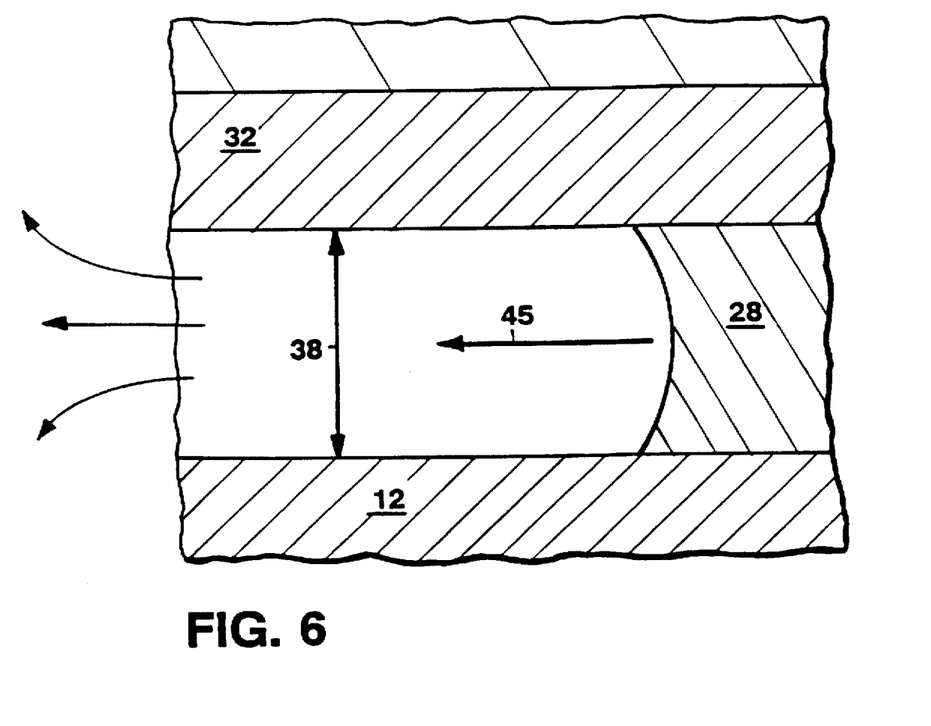
FIG. 6 is an enlarged cross-sectional view at 6—6 in FIG. 3.

When heat is applied and the solder is reflowed it is drawn (e.g., by capillary action) to flow through gap 38. The staggered legs 18 cause the solder to flow in a "serpentine" or "S" shaped main solder flow stream, indicated by arrow 42 (FIG. 1), through gap 38. Peripheral solder flow streams, indicated by arrows 44, are generated from the main stream 42 toward the edges of component 10. Referring to FIG. 6, the serpentine flow pattern with main and peripheral streams has the effect of forcing, arrow 45, air and flux liquids out of gap 38 ahead of flowing solder 28 (i.e., both main stream 42 and peripheral streams 44). As a result, voids between surface 12 and component 10 are reduced.

Other embodiments are within the scope of the following claims.

A solder flow control pattern 16 may be useful in reducing voids in any similar situation where a fixed gap is provided (with or without epoxy dots) between a component and a metal surface prior to flowing solder. Pattern 16 can be applied to either the metal surface 12 or to the bottom side of component 10 or to both. The method could be used to direct the flow of solder and prevent voids in other circumstances. For instance, copper pad 72 (FIGS. 2-5) could have a similar pattern applied before die 14 is mounted to prevent voids between pad 72 and die 14. A similar pattern could be used to solder a metal surface of a heat sink onto an electrical component.

Figure 7A:
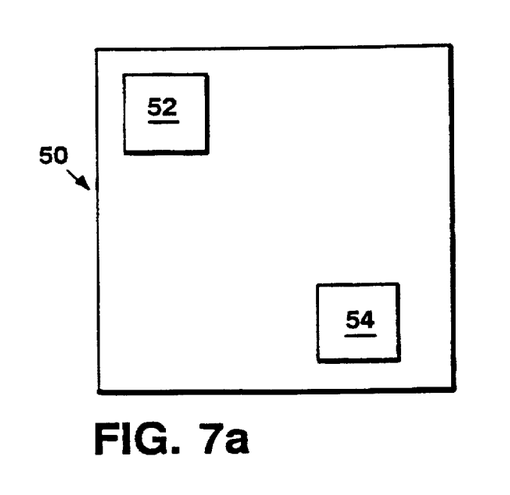
FIG. 7a is a plan view of a component.
Figure 7B:
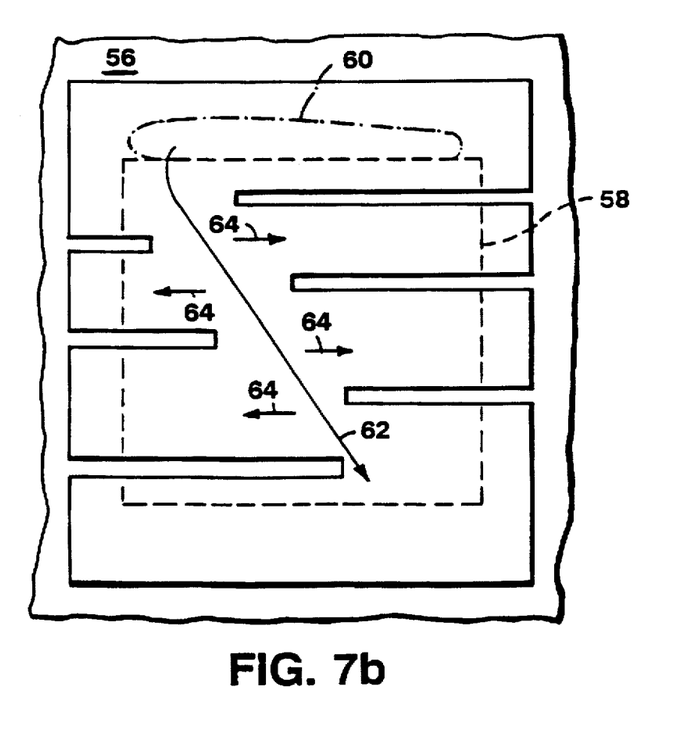
FIG. 7b is a plan view of a solder flow control pattern.

The solder flow path need not be tortuous, but may be controlled to achieve a wide variety of other kinds of paths. For example, referring to FIG. 7a, if a component 50 included two semiconductor dies 52, 54, a flow control pattern 56 (FIG. 7b), could direct the solder 60 along a straight main solder flow stream 62 and along peripheral flow streams 64. The main and peripheral flow streams would reduce the formation of voids especially in the areas of dies 52, 54.

Figure 8:
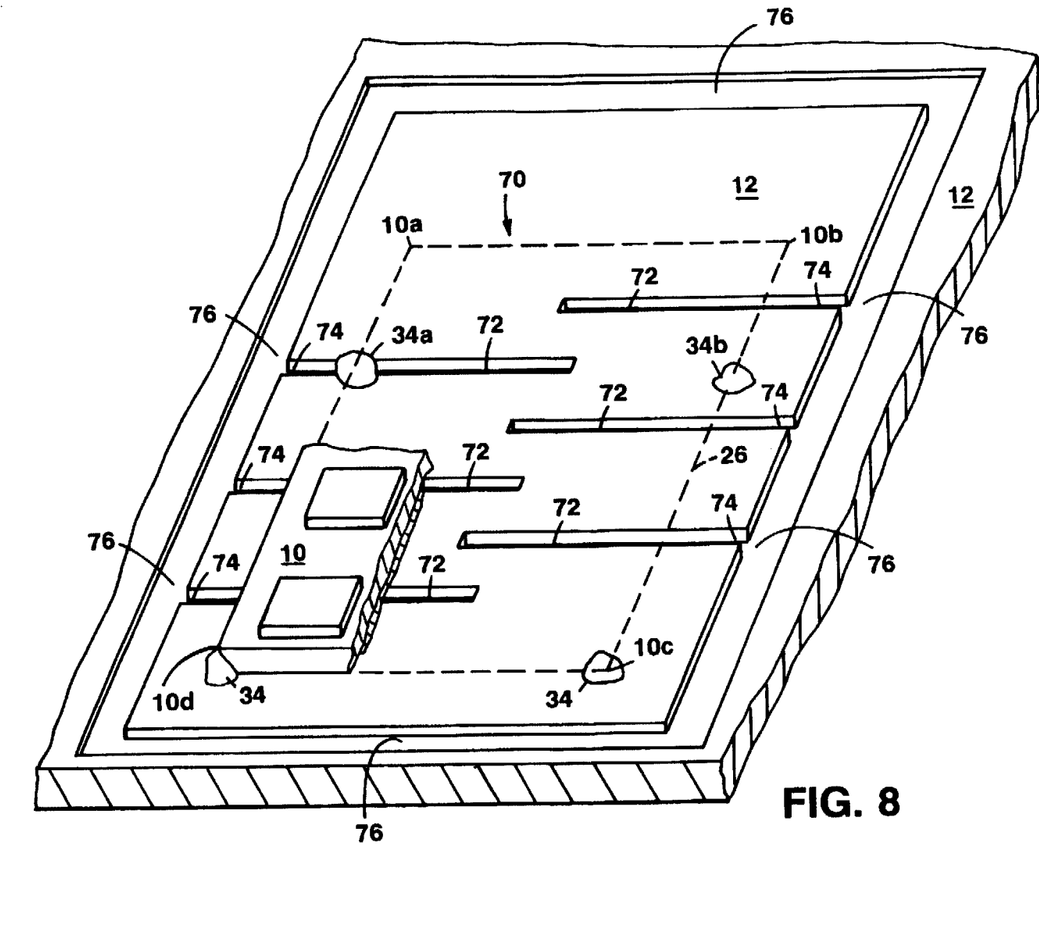
FIG. 8 is a perspective view of a recessed solder flow control pattern.

Other methods could be used to form the solder flow control pattern. For instance, surface 12 or copper layer 32 could be chemically etched, mechanically cut, or burned by laser to form a pattern 70 (FIG. 8) of channels 72. If the wettability of the materials 74, 76 exposed by the removal of surface material is poorer than that of the surface itself, solder paste will be discouraged from flowing over the material exposed by the cutting away of surface material from surface 12 or copper layer 32. For example, if surface 12 is a thin layer of copper plated over an aluminum base, then the surface may be etched or laser-cut to expose a pattern of aluminum. Tin/lead solder will readily flow over the copper but will not wet to the exposed aluminum. Pattern 70 (FIG. 8) could be stamped into surface 12 or copper layer 32. A film of material to which the solder paste will not flow, such as Kapton MT, manufactured and sold by Dupont Films, Circleville, Ohio, USA, could be laminated onto surface 12 or copper layer 32 to form solder flow control pattern 16. It is even conceivable that the flow pattern could be established other than by a physical or mechanical "mark", e.g., by establishing a temperature profile to define the pattern.

Raised patterns do not have to completely fill gap 38 (e.g., as legs 18 are shown to do in FIG. 3) but only need to be thick enough to discourage molten solder from flowing over the region of the surface to which the pattern is applied. On the other hand, a pattern of controlled thickness is a convenient way to set the thickness of gap 38.

What is claimed is:

1. A method for flowing solder in a gap between two surfaces, comprising
providing a supply of solder,
heating the solder to cause it to reflow and flow in the gap, and
directing the solder to flow as a main stream in the gap and to flow as peripheral streams from the main stream toward edges of the gap.

2. The method of claim 1 wherein directing comprises providing a solder flow control pattern within the gap.

3. The method of claim 1 wherein directing comprises causing the main stream to follow a tortuous path.

4. The method of claim 3 wherein directing comprises causing the main stream to follow a serpentine path.

5. The method of claim 3 wherein directing comprises causing the main stream to follow a straight path.

6. The method of claim 1 wherein providing comprises placing solder at an edge of the gap.

7. The method of claim 6 wherein directing comprises providing an unrestricted portal at the edge of the gap for flow of solder into the gap.

8. A method for aiding flow of solder in a gap between two surfaces comprises
forming flow controlling elements to define a pattern including a main solder flow path and peripheral solder flow paths from the main solder flow path, and
holding the two surfaces in positions to form a gap between them and with the pattern in the gap.

9. The method of claim 8 wherein forming comprises cutting the flow controlling elements into one of the surfaces.

10. The method of claim 9 wherein the flow controlling elements are milled with a machine tool.

11. The method of claim 9 wherein the flow controlling elements are cut with a chemical etching process.

12. The method of claim 8 wherein the surfaces are solder wettable.

13. A method for aiding flow of solder in a gap between two surfaces comprising
cutting a pattern of flow controlling elements into one of the surfaces with a laser, and
holding the two surfaces in positions to form a gap between them and with the pattern in the gap.

14. A method for aiding flow of solder in a gap between two surfaces comprising
stamping a pattern of flow controlling elements into one of the two surfaces, and
holding the two surfaces in positions to form a gap between them and with the pattern in the gap.

15. A method for aiding flow of solder in a space between two solderable surfaces comprising
holding the two surfaces in positions to form a space between them, including
dispensing epoxy dots on one of the two surfaces at predetermined points,
placing the other of the two surfaces on the epoxy dots, the epoxy dots establishing the space, and
curing the epoxy dots.

16. The method of claim 15, further comprising
forming a pattern of flow controlling elements in one of the two surfaces.

17. The method of claim 16 wherein the pattern and the epoxy dots establish the space.

18. A structure comprising
two surfaces separated by a gap,
a pattern of solder flow control elements in the gap, and
a solder joint in the gap, the configuration of the solder joint being defined by the flow control elements to include a main solder path and peripheral solder paths from the main solder path.

19. The structure of claim 18 wherein the control elements are a solder mask.

20. The structure of claim 18 wherein the surfaces are thermally conductive.

21. The structure of claim 18 wherein the surfaces are solder wettable.

22. The structure of claim 18 wherein the control elements comprise fingers.

23. The structure of claim 18 wherein the control elements comprise a film.

24. A structure comprising two surfaces separated by a gap, a film pattern of solder flow control elements in the gap, wherein the film comprises Kapton MT, and a solder joint in the gap, the configuration of the solder joint being defined by the flow control elements.

25. A method for flowing solder in a gap between two surfaces, comprising providing a supply of solder, heating the solder to cause it to reflow and flow in the gap, and directing the solder to flow as a main stream and as peripheral streams from the main stream.

26. A structure comprising two surfaces separated by a gap, a pattern of staggered solder flow control elements in the gap, and a solder joint in the gap, the configuration of the solder joint being defined by the flow control elements.

* * * * *